(12) United States Patent
Shen

(10) Patent No.: US 11,703,558 B1
(45) Date of Patent: Jul. 18, 2023

(54) SYSTEM AND METHOD FOR UTILIZING DUAL SPATIAL SATURATION PULSES TO COMPENSATE FOR CHEMICAL SHIFT DISPLACEMENT IN A SPATIAL SATURATION BAND

(71) Applicant: GE Precision Healthcare LLC, Wauwatosa, WI (US)

(72) Inventor: Hao Shen, Waukesha, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/736,670

(22) Filed: May 4, 2022

(51) Int. Cl.
  *G01R 33/48* (2006.01)
  *G01R 33/483* (2006.01)
  *G01R 33/56* (2006.01)
  *G01R 33/565* (2006.01)

(52) U.S. Cl.
  CPC ..... *G01R 33/4828* (2013.01); *G01R 33/4838* (2013.01); *G01R 33/5608* (2013.01); *G01R 33/5659* (2013.01)

(58) Field of Classification Search
  None
  See application file for complete search history.

(56) References Cited

U.S. PATENT DOCUMENTS

| | | | | |
|---|---|---|---|---|
| 4,585,993 | A * | 4/1986 | Bottomley | G01R 33/485 324/309 |
| 5,510,713 | A | 4/1996 | Bernstein | |
| 2007/0229070 | A1* | 10/2007 | Miyazaki | G01N 24/08 324/307 |
| 2022/0082645 | A1* | 3/2022 | Zhang | G01R 33/5607 |

OTHER PUBLICATIONS

Ohno, et al., "Water and lipoid diffusion MRI using chemical shift displacement-based separation of lipid tissue (SPLIT)", Magnetic Resonance Imaging, 30 (2017) 144-148. (Year: 2017).*

* cited by examiner

*Primary Examiner* — Rodney E Fuller
(74) *Attorney, Agent, or Firm* — Fletcher Yoder, P.C.

(57) ABSTRACT

A method to compensate for chemical shift displacement includes, prior to applying an imaging pulse sequence to acquire MRI data of a subject, applying a first saturation pulse within a slice location of an imaging volume of the subject in which the MRI data is to be acquired, wherein the first saturation pulse results in a first chemical shift displacement between water and fat in a first spatial saturation band. The method also includes, prior to applying the imaging pulse sequence, subsequently applying a second saturation pulse within the slice location, wherein the second saturation pulse results in a second chemical displacement between the water and the fat in a second spatial saturation band that results in a final spatial saturation band being free of chemical shift displacement after application of the second saturation pulse, the second chemical shift displacement being different from the first chemical shift displacement.

20 Claims, 10 Drawing Sheets

SYSTEM AND METHOD FOR UTILIZING DUAL SPATIAL SATURATION PULSES TO COMPENSATE FOR CHEMICAL SHIFT DISPLACEMENT IN A SPATIAL SATURATION BAND

BACKGROUND

The subject matter disclosed herein relates to medical imaging and, in particular, utilizing dual spatial saturation pulses to compensate for chemical shift displacement in a spatial saturation band.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Traditional spatial saturation pulses involve the application of radio frequency (RF) energy to suppress the MR signal from tissues in particular locations. Spatial saturation pulses may be utilized to suppress either unwanted signal outside the image volume. Also, spatial saturation pulses may be utilized to reduce or eliminate motion artifacts. The suppressed volumes of different metabolites are shifted depending on both the chemical shift amount and the bandwidth of the RF pulse. A higher bandwidth RF pulse may be utilized to reduce the chemical shift displacement, but it usually needs higher maximum $B_1$ to achieve higher bandwidth. However, this limits the reusage of existing pulse on higher field systems.

BRIEF DESCRIPTION

Certain examples commensurate in scope with the originally claimed subject matter are summarized below. These examples are not intended to limit the scope of the claimed subject matter, but rather these examples are intended only to provide a brief summary of possible examples. Indeed, the subject matter may encompass a variety of forms that may be similar to or different from the examples set forth below.

In one aspect, a method for operating an MRI system to compensate for chemical shift displacement is provided. The method includes, prior to applying an imaging pulse sequence to acquire MRI data of a subject, applying a first spatial saturation pulse within a slice location of an imaging volume of the subject in which the MRI data is to be acquired, wherein the first spatial saturation pulse results in a first chemical shift displacement between water and fat in a first spatial saturation band. The method also includes, prior to applying the imaging pulse sequence, subsequently applying a second spatial saturation pulse within the slice location, wherein the second spatial saturation pulse results in a second chemical displacement between the water and the fat in a second spatial saturation band that results in a final spatial saturation band being free of chemical shift displacement after application of the second spatial saturation pulse, the second chemical shift displacement being different from the first chemical shift displacement.

In another aspect, an MRI apparatus is provided. The MRI apparatus includes an MRI system having a plurality of gradient coils positioned about a bore of a magnet, a radio frequency (RF) transceiver system and an RF switch controlled by a pulse module to transmit RF signals to an RF coil assembly to acquire MRI images. The MRI apparatus also includes a computer coupled to the MRI system and programmed to execute acts. The acts include, prior to applying an imaging pulse sequence to acquire MRI data of a subject, applying a first spatial saturation pulse within a slice location of an imaging volume of the subject in which the MRI data is to be acquired, wherein the first spatial saturation pulse results in a first chemical shift displacement between water and fat in a first spatial saturation band. The acts also include, prior to applying the imaging pulse sequence, subsequently applying a second spatial saturation pulse within the slice location, wherein the second spatial saturation pulse results in a second chemical displacement between the water and the fat in a second spatial saturation band that results in a final spatial saturation band being free of chemical shift displacement after application of the second spatial saturation pulse, the second chemical shift displacement being different from the first chemical shift displacement.

In a further aspect, a non-transitory computer-readable medium including processor-executable code that when executed by one or more processors, causes the one or more processors to perform acts is provided. The acts include, prior to applying an imaging pulse sequence to acquire MRI data of a subject, applying a first spatial saturation pulse within a slice location of an imaging volume of the subject in which the MRI data is to be acquired, wherein the first spatial saturation pulse results in a first chemical shift displacement between water and fat in a first spatial saturation band. The acts also include, prior to applying the imaging pulse sequence, subsequently applying a second spatial saturation pulse within the slice location, wherein the second spatial saturation pulse results in a second chemical displacement between the water and the fat in a second spatial saturation band that results in a final spatial saturation band being free of chemical shift displacement after application of the second spatial saturation pulse, the second chemical shift displacement being different from the first chemical shift displacement.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

One or more specific examples will be described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various aspects of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed examples.

The disclosed examples provide techniques for compensating for chemical shift displacement in a spatial saturation band. In particular, prior to applying an imaging pulse sequence to acquire MRI data of a subject, dual spatial saturation pulses are applied within a slice location. Specifically, two well calculated individual spatial saturation pulses with a same amplitude but opposite gradient directions are sequentially applied to generate different chemical shift displacements. The combination of the two calculated spatial saturation pulses results in a final spatial saturation band being insensitive to or free of chemical shift displacement. The frequency offset of each of the pair of spatial saturation pulses can be calculated based on the prescription for the final spatial saturation band (e.g., the prescribed effective slice thickness of the final spatial saturation band and the prescribed effective location of the final spatial saturation band). The utilization of dual spatial saturation pulses is less sensitive to pulse bandwidth. The disclosed techniques enable the generation of spatial saturation bands with less sensitivity to chemical shift displacement.

Figure 1:
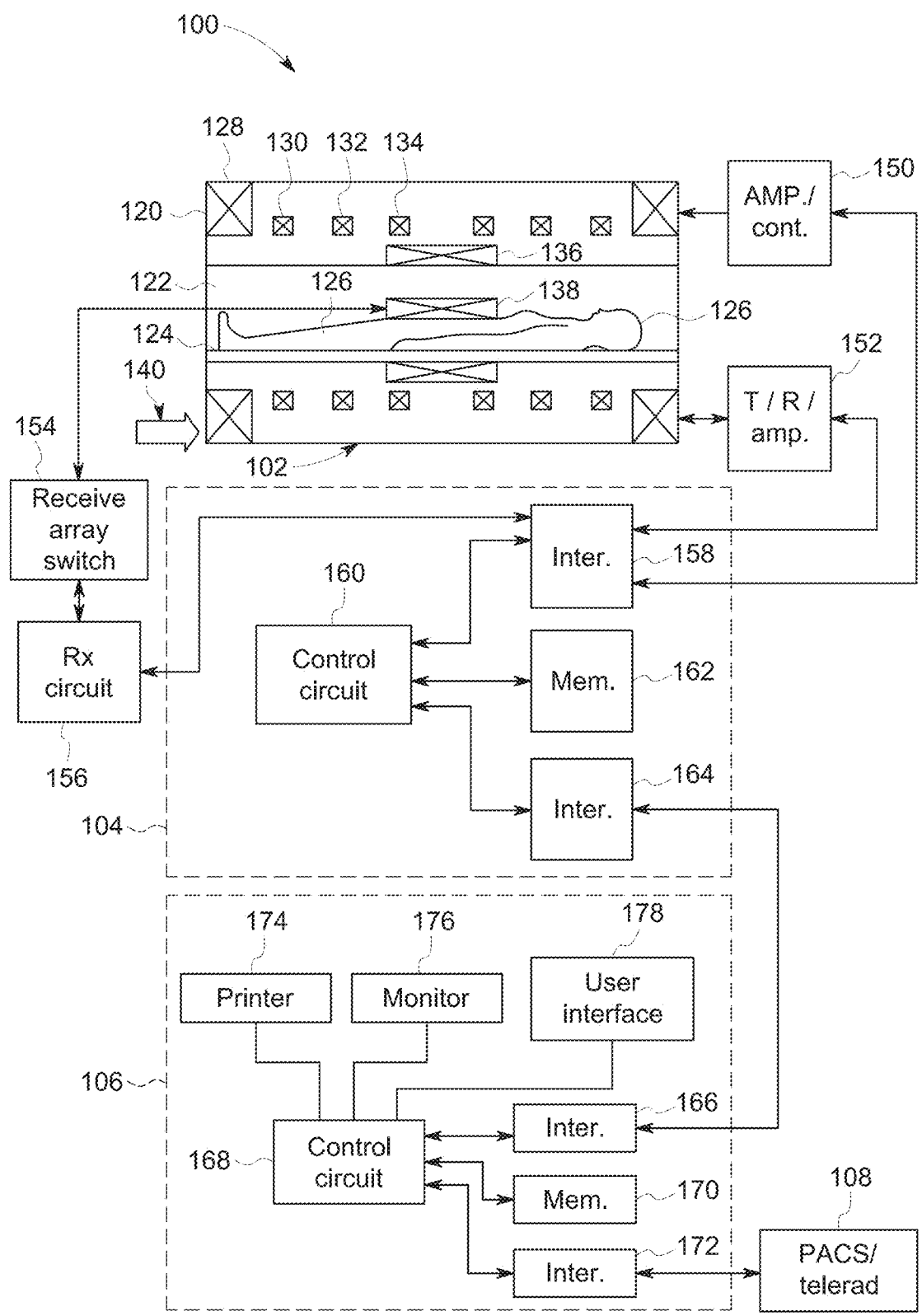
FIG. 1 illustrates an example of an MRI system suitable for use with the disclosed technique.

With the preceding in mind, FIG. 1 an (MRI) system 100 is illustrated schematically as including a scanner 102, scanner control circuitry 104, and system control circuitry 106. According to the examples described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated example, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated example, a main power supply 140 provides power to the primary field coil 128 to generate the primary magnetic field, $B_0$. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain aspects, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data. In certain aspects, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated example, these peripherals include a printer 174, a monitor 176, and user interface 178 including devices such as a keyboard, a mouse, a touchscreen (e.g., integrated with the monitor 176), and so forth.

Figure 2:
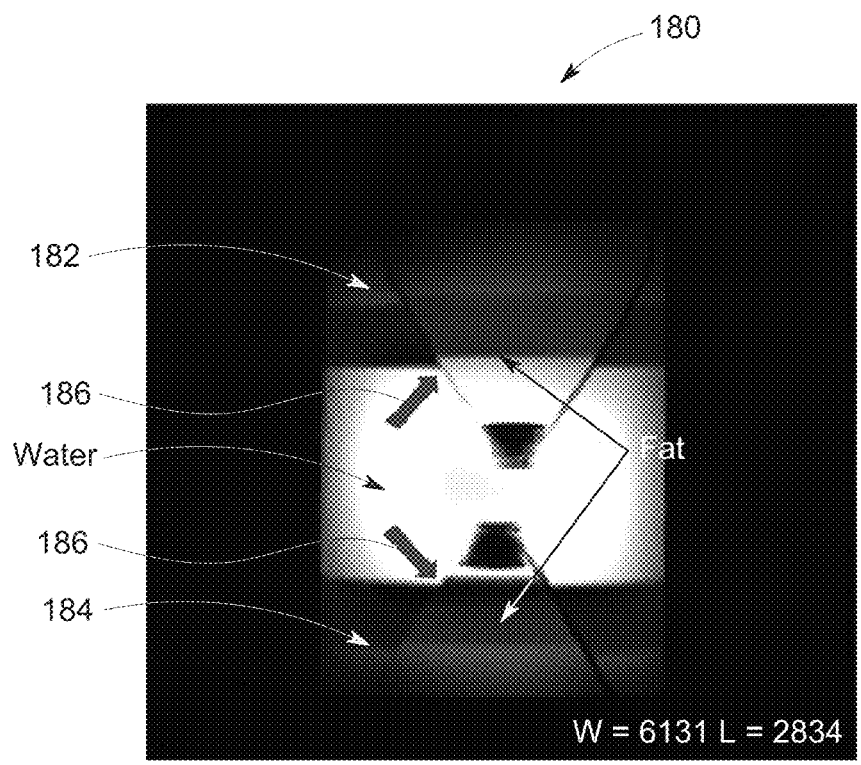
FIG. 2 is an example of an image from a phantom scan illustrating chemical shift in a spatial saturation band.

As noted above, the techniques disclosed below are for compensating for chemical shift displacement in a spatial saturation band. Chemical shift displacement may be an issue in various clinical scenarios involving MRI. For example, saturation bands outside of an imaging volume may suppress the fat signal inside the imaging volume. In another example, saturation bands outside of a magnetic resonance spectroscopy (MRS) voxel may suppress the fat signal inside the MRS voxel. In a further example, saturation band displacement may be observable between water and fat tissues. FIG. 2 is an example of an image 180 from a phantom scan illustrating chemical shift in a spatial saturation band. The image 180 was acquired via an MRI scan of a phantom having both water and fat tissue after the application of spatial saturation pulses in different slice locations. The spatial saturation pulses resulted in a spatial saturation band 182 in the upper part of the image 180 and a spatial saturation band 184 in a lower part of the image 180. Chemical shift resulted in saturation shifts between the water and fat tissues in the saturation bands 182 and 184. The chemical shift displacement is indicated by arrows 186 in FIG. 2. The chemical shift direction correlates to a polarity of the band selection gradient (i.e., the gradient magnetic field pulse applied to determine the slice or spatial location).

Figure 3:
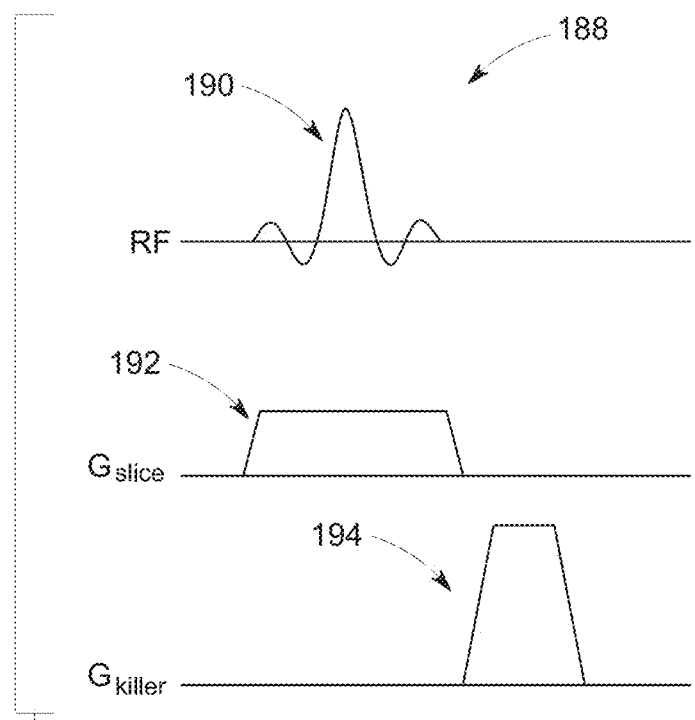
FIG. 3 is schematic diagram of a pulse sequence for generating a spatial saturation band.

FIG. 3 is a schematic diagram of a pulse sequence 188 for generating a spatial saturation band with an MRI system (e.g., MRI system 100 in FIG. 1). An RF pulse 190 and a slice-selective gradient pulse ($G_{slice}$) 192 (e.g., slice-selective magnetic field pulse gradient) are applied simultaneously followed by a killer gradient pulse ($G_{killer}$) 194 (e.g., killer magnetic field pulse gradient). The RF pulse 190 results in spin excitation. Working together with the bandwidth of the RF pulse, the slice-selective gradient pulse 192 determines the thickness of the spatial saturation band. The frequency offset of the RF pulse from the center frequency determines the slice location of the spatial saturation band. The killer gradient pulse 194 dispenses the phase of spins.

Figure 4:
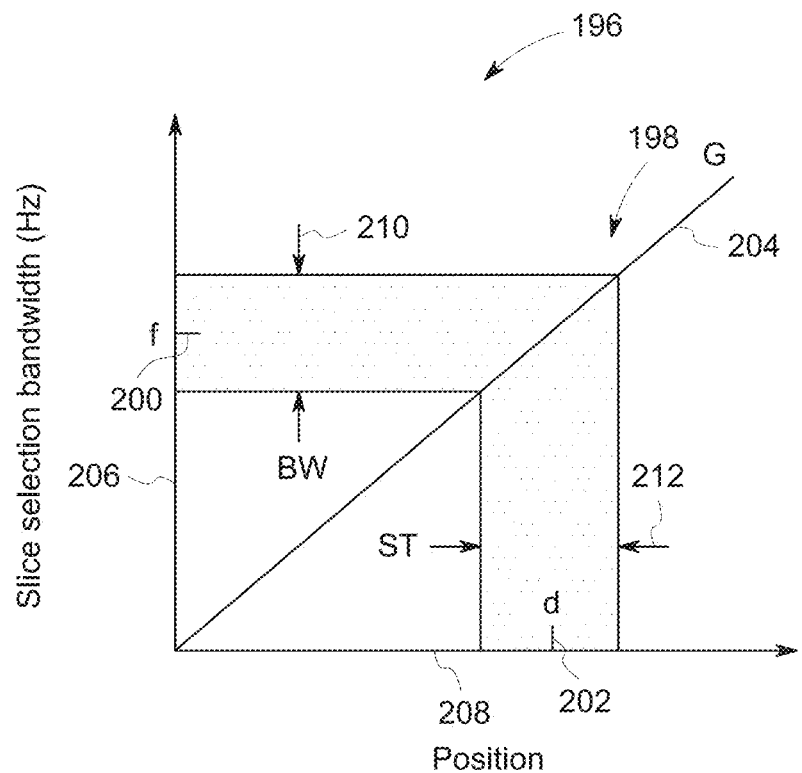
FIG. 4 is a schematic diagram illustrating spatial saturation band (slice) selection.

FIG. 4 is a schematic diagram illustrating spatial saturation band (slice) selection (e.g., for the pulse sequence 188 in FIG. 3). Plot 196 in FIG. 4 illustrates a spatial saturation band 198 relative to a frequency offset (f) 200 to excite the spatial saturation band 198, a location offset (d) 202 of the spatial saturation band 198 relative to the iso-center, and the gradient (G) 204 (e.g., slice-selective gradient) applied to select the spatial location of the spatial saturation band 198. The y-axis 206 represents slice selection bandwidth and the x-axis 208 represents a position or location along a slice selection axis. Line 204 represents the gradient. The slope of the line 204 corresponds to the gradient amplitude. Bandwidth (BW) of the RF pulse used to excite the spatial saturation band 198 is indicated by arrows 210. The frequency offset 200 is located within the bandwidth 210. Slice thickness (ST) of the spatial saturation band 198 is indicated by arrows 212. Frequency offset is determined by the following:

$$f = \gamma \cdot G \cdot d = BW \cdot d/ST = \frac{BW}{ST} \cdot d, \quad (1)$$

where $\gamma$ represents the gyromagnetic ratio, a constant specific to each specific nucleus or particle.

Figure 5:
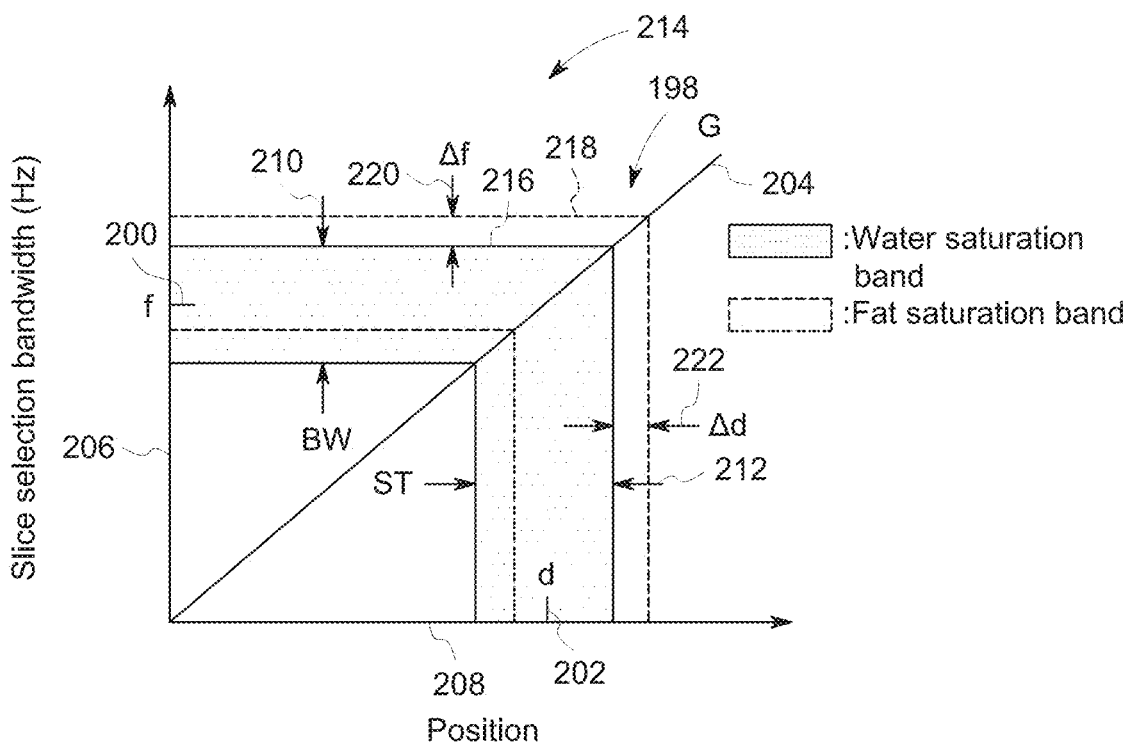
FIG. 5 is a schematic diagram illustrating chemical shift displacement in a spatial saturation band (e.g., when utilizing a single saturation pulse)

As noted above, different metabolites (e.g., water and fat tissue) may experience chemical shift displacement in a spatial saturation band. FIG. 5 is a schematic diagram illustrating chemical shift displacement in the spatial saturation band 198. As depicted in plot 214 in FIG. 5, a water saturation band 216 and a fat saturation band 218 of the spatial saturation band 198 experience a chemical shift displacement relative to each other. In particular, the fat saturation band 218 has shifted relative to the frequency offset 200 and the water saturation band 216. The chemical shift and slice location shift between the water saturation band 216 and the fat saturation band 218 are interrelated as indicated by the following:

$$f + \Delta f = \frac{BW}{ST} \cdot (d + \Delta d), \quad (2)$$

where $$\Delta f = \frac{BW}{ST} \cdot \Delta d \quad (3)$$

and $$\Delta d = \frac{ST}{BW} \cdot \Delta f. \quad (4)$$

In the above, $\Delta f$ represents the chemical shift between the fat and water and $\Delta d$ represents an excited slice location shift between fat and water. Arrows 220 in FIG. 5 indicate the chemical shift. Arrows 222 in FIG. 5 indicate the excited slice location shift. Different MRI machines may result in different chemical shifts between fat and water.

Figure 6:
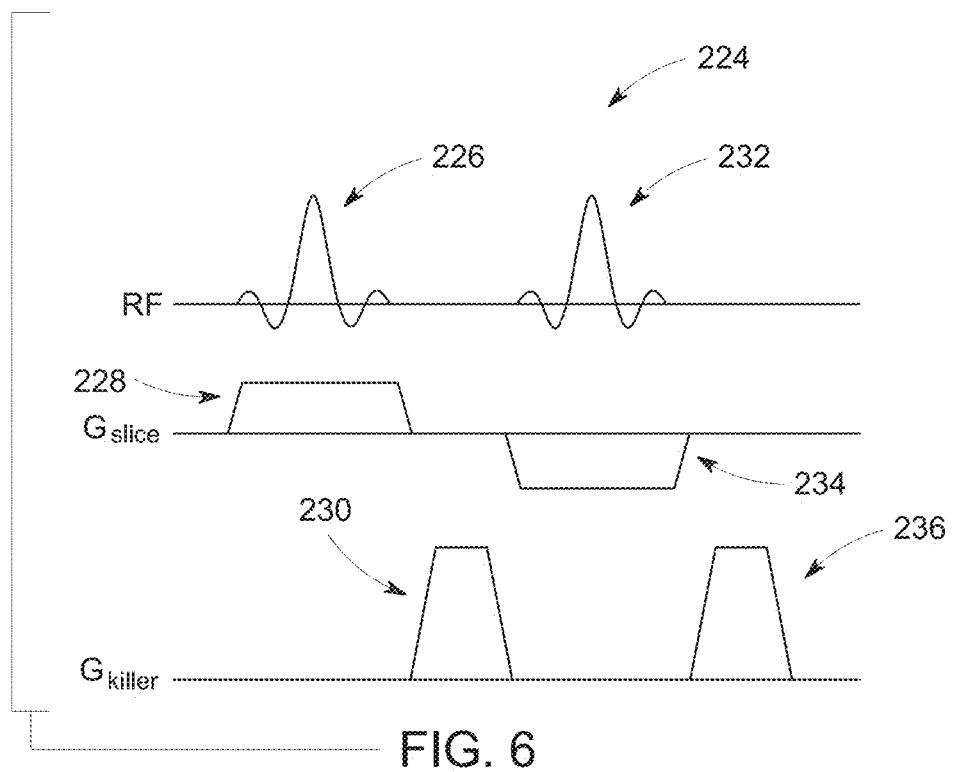
FIG. 6 is a schematic diagram of a pulse sequence for generating a spatial saturation band free of chemical shift (e.g., utilizing dual saturation pulses), in accordance with aspects of the present disclosure.

Dual saturation pulses may be utilized to compensate for chemical shift displacement in a spatial saturation band. FIG. 6 is a schematic diagram of a pulse sequence 224 for generating a spatial saturation band free of chemical shift (e.g., utilizing dual saturation pulses). A first RF pulse 226 and a first slice-selective gradient pulse ($G_{slice}$) 228 (e.g., slice-selective magnetic field pulse gradient) are applied simultaneously followed by a first killer gradient pulse ($G_{killer}$) 230 (e.g., killer magnetic field pulse gradient) to generate a first spatial saturation band. The RF pulse 226 results in spin excitation. The slice-selective gradient pulse 228 determines a spatial location of the first spatial saturation band. The killer gradient pulse 230 dispenses the phase of spins. Subsequently (immediately following the first killer gradient 230), a second RF pulse 232 and a second slice-selective gradient pulse 234 (e.g., slice-selective magnetic field pulse gradient) are applied simultaneously followed by a second killer gradient pulse 236 (e.g., killer magnetic field pulse gradient) to generate a second spatial saturation band. The RF pulse 232 results in spin excitation. The slice-selective gradient pulse 234 determines a spatial location of the second spatial saturation band. The second killer gradient pulse 236 dispenses the phase of spins. The application of the dual spatial saturation pulses occurs in the same slice location. As depicted in FIG. 6, the first slice-selective gradient pulse 228 and the second slice-selective gradient pulse 234 have the same gradient amplitude. In addition, the first slice-selective gradient pulse 228 and the second slice-selective gradient pulse 234 have opposite gradient directions. The first killer gradient pulse 230 and the second gradient pulse 232 have the same gradient amplitude and the same gradient direction. The final spatial saturation band (in an image derived from MRI data acquired of a subject utilizing an imaging pulse sequence applied after the application of the pulse sequence 224) generated from the first spatial saturation band and the second spatial saturation band is free of or insensitive to chemical shift.

Figure 7:
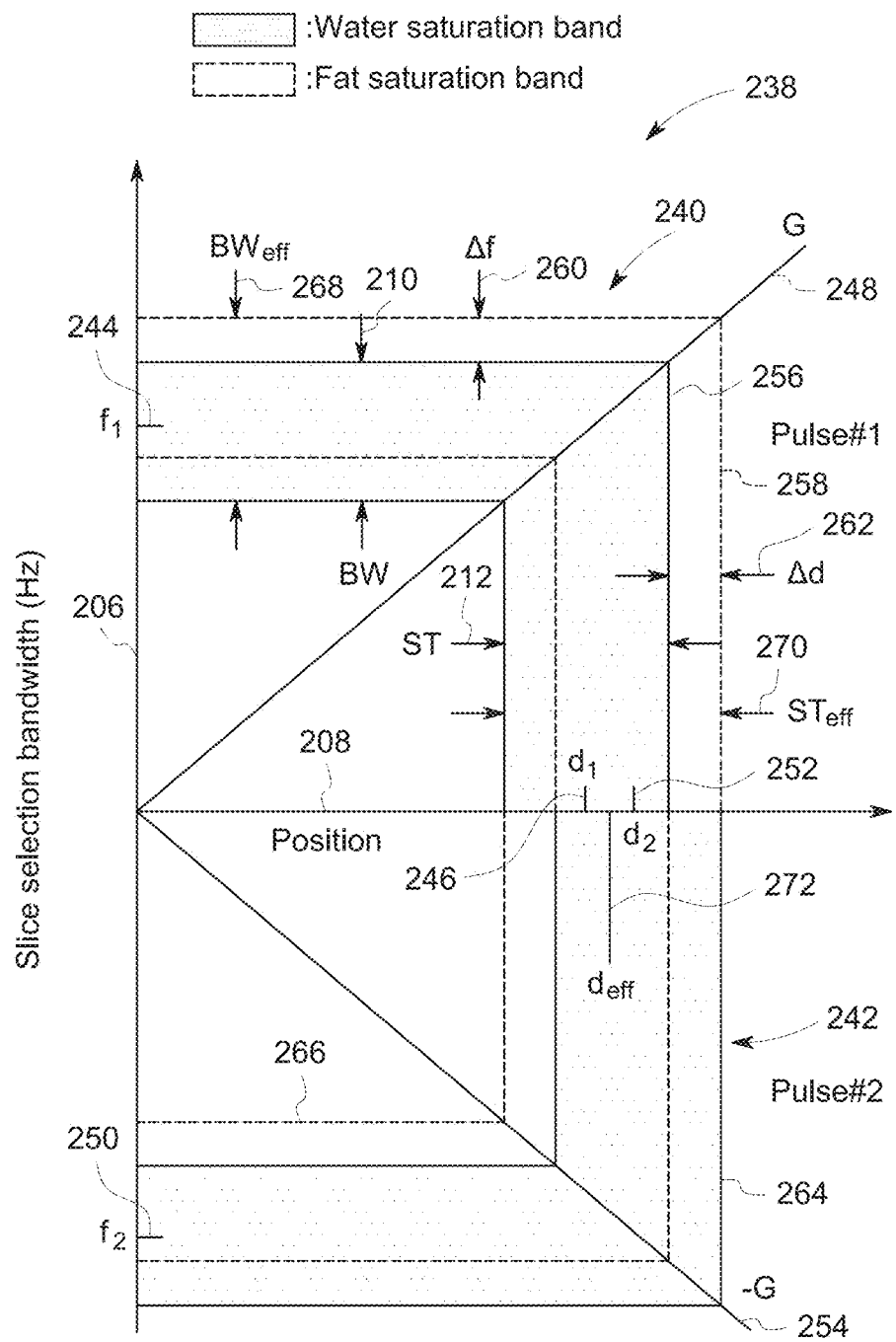
FIG. 7 is a schematic diagram illustrating chemical shift displacement in respective spatial saturation bands (e.g., when utilizing dual spatial saturation pulses), in accordance with aspects of the present disclosure.

FIG. 7 is a schematic diagram illustrating chemical shift displacement in respective spatial saturation bands (e.g., when utilizing dual saturation pulses such as in pulse sequence 224 in FIG. 6). An upper portion of plot 238 represents the chemical shift displacement for a first spatial saturation band 240 generated by a first spatial saturation pulse (i.e., Pulse#1). A lower portion of plot 238 represents the chemical shift displacement for a second spatial saturation band 242 generated by a second subsequent spatial saturation pulse (i.e., Pulse#2).

A first frequency offset ($f_1$) 244 excites the first spatial saturation band 240. Location ($d_1$) 246 is the location of the first spatial saturation pulse (Pulse#1). The spatial location of the first spatial saturation band 240 is determined by the application of a first gradient (G) 244 (e.g., slice-selective gradient). A second frequency offset ($f_2$) 250 excites the second spatial saturation band 242. Location ($d_2$) 252 is the location of the second spatial saturation pulse (Pulse#2). The spatial location of the second spatial saturation band 242 is determined by the application of a second gradient (−G) 254 (e.g., slice-selective gradient). The y-axis 206 represents slice selection bandwidth and the x-axis 208 represents a position or location along a slice selection axis. Line 248 represents the first gradient. Line 254 represents the second gradient. The respective slope each of each line 248, 254 corresponds to the gradient amplitude. As depicted in FIG. 7, the first gradient 248 and the second gradient 254 have opposite gradient directions. Bandwidth (BW) of the first RF pulse (Pulse#1) used to excite the first spatial saturation band 240 is indicated by arrows 210. The first frequency offset 244 is located within the bandwidth 210. The second RF pulse (Pulse#2) has the same bandwidth. The second frequency offset 250 is located within the bandwidth. Slice thickness (ST) of the first spatial saturation band 240 is indicated by arrows 212. The slice thickness is the same for second spatial saturation band 242.

As depicted in FIG. 7, a water saturation band 256 and a fat saturation band 258 of the first spatial saturation band 240 experience a chemical shift displacement relative to each other. In particular, the fat saturation band 258 has shifted relative to the first frequency offset 244 and the water saturation band 216. In particular, the first spatial saturation band 240 has a chemical shift ($\Delta f$) between fat and water (indicated by arrows 260) and an excited slice location shift ($\Delta d$) between fat and water (indicated by arrows 262). Also, the water saturation band 264 and a fat saturation band 266 of the second spatial saturation band 242 experience a chemical shift displacement relative to each other. In particular, the fat saturation band 266 has shifted relative to the second frequency offset 250 and the water saturation band 264. Similar to the first spatial saturation band 240, the second spatial saturation band 242 has a chemical shift ($\Delta f$) between fat and water and an excited slice location shift ($\Delta d$) between fat and water. However, the respective chemical shifts ($\Delta f$) between fat and water in the first spatial saturation band 240 and the second spatial saturation band occur in opposite directions along the slice selection bandwidth but at a same or similar amount. Also, the respective excited slice location shifts ($\Delta d$) between fat and water in the second spatial saturation band 242 occur in opposite directions along the position or location along a slice selection axis but at a same or similar amount.

As depicted in FIG. 7, the first spatial saturation band 240 and the second spatial saturation band 242 overlap both along the slice selection bandwidth and the position along the slice selection axis. This overlap enables compensation for chemical shift displacement in a final spatial saturation band generated between the first spatial saturation band 240 and the second spatial saturation band 242. To generate a final spatial saturation band insensitive to or free of chemical shift displacement (and achieve the desired saturation effect), the effective bandwidth ($BW_{eff}$) (indicate by arrows 268) of each of the first spatial saturation pulse (Pulse#1) and the second spatial saturation pulse (Pulse#2) must be larger than the chemical shift 260 between fat and water. A user prescribes (via an input into a user interface of an MRI system) an effective slice thickness ($ST_{eff}$) of the final spatial saturation band. The effective slice thickness is indicated arrows 270. A user also prescribes (via an input into a user interface of an MRI system) an effective location ($d_{eff}$) 272 of the final spatial saturation band. The effective location 272 of the final spatial saturation band falls between the location 246 of the first spatial saturation band 240 and the location 252 of the second spatial saturation band 242 along the slice selection axis. The effective bandwidth 268 may be determined by the following:

$$BW_{eff} = BW + \Delta f. \quad (5)$$

The effective slice thickness 270 relates to slice thickness as indicated in the following:

$$ST_{eff} = ST + \Delta d. \quad (6)$$

Based on these, $$\frac{ST}{ST_{eff}} = \frac{BW}{BW_{eff}} = \frac{BW}{BW + \Delta f}, \quad (7)$$

$$ST = \frac{BW}{BW + \Delta f} \cdot ST_{eff}, \quad (8)$$

and $$\Delta d = \frac{\Delta f}{BW + \Delta f} \cdot ST_{eff}. \quad (9)$$

From these, the location 246 of the first spatial saturation band 240 and the location 252 of the second spatial saturation band 242 along the slice selection axis may be determined by the following:

$$d_1 = d_{eff} - \frac{\Delta d}{2} = -\frac{\Delta f \cdot ST_{eff}}{2(BW + \Delta f)} + d_{eff} \quad (10)$$

and $$d_2 = -\left(d_{eff} + \frac{\Delta d}{2}\right) = -\frac{\Delta f \cdot ST_{eff}}{2(BW + \Delta f)} - d_{eff}. \quad (11)$$

Based on the prescribed effective slice thickness 270 of the final spatial saturation band and the prescribed effective location 272 of the final spatial saturation band, the respective frequency offsets 244, 250 can be calculated as shown in the following:

$$f_1 = \frac{BW}{ST} \cdot d_1 = \frac{BW}{ST_{eff}} \cdot \left(-\frac{\Delta d}{2} + d_{eff}\right) = -\frac{BW \cdot \Delta f}{2(BW + \Delta f)} + \frac{BW \cdot d_{eff}}{ST_{eff}} \quad (12)$$

and $$f_2 = \frac{BW}{ST} \cdot d_2 = \frac{BW}{ST_{eff}} \cdot \left(-\frac{\Delta d}{2} - d_{eff}\right) = -\frac{BW \cdot \Delta f}{2(BW + \Delta f)} - \frac{BW \cdot d_{eff}}{ST_{eff}}. \quad (13)$$

Figure 8:
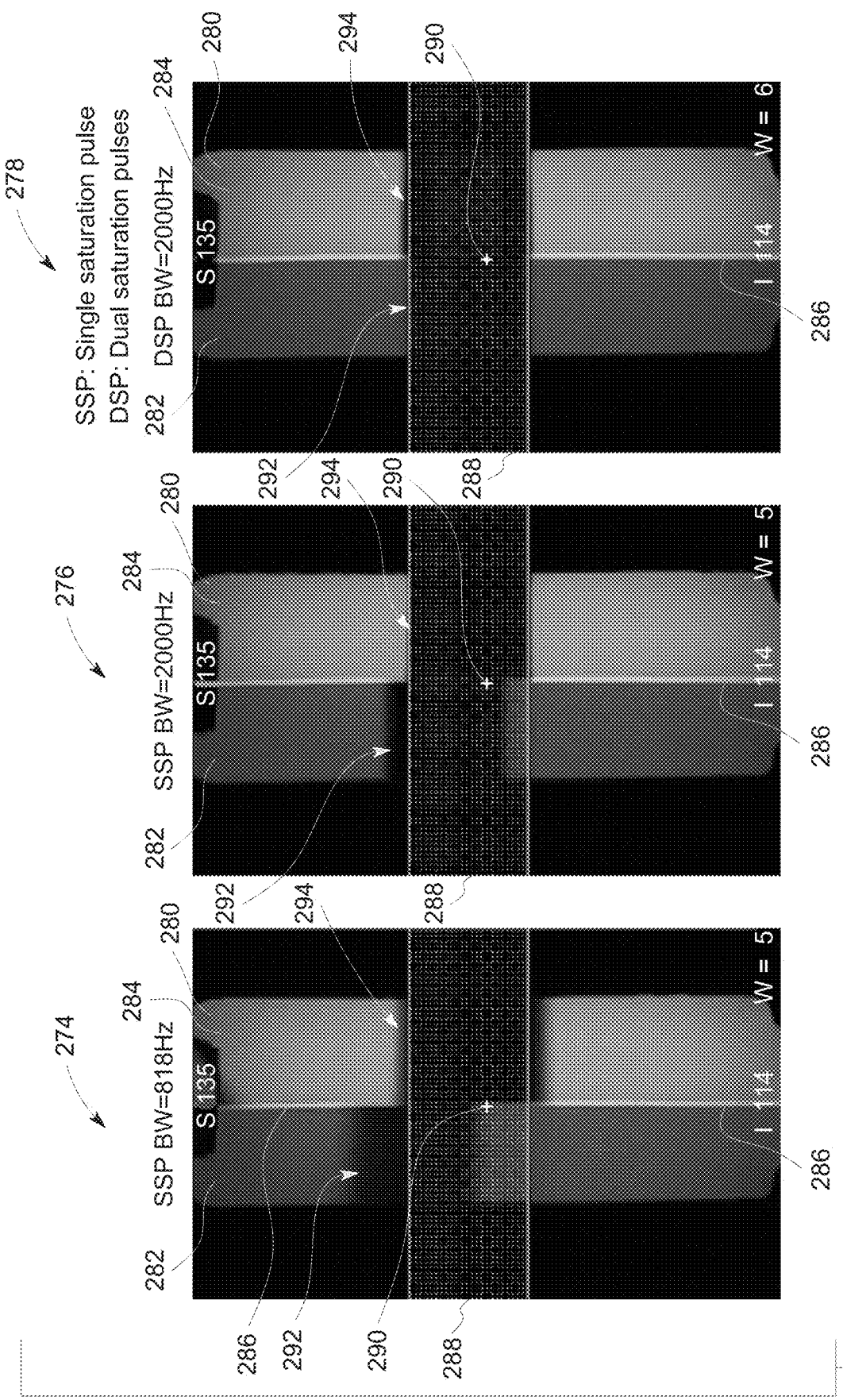
FIG. 8 is images of a phantom with a prescribed spatial saturation band applied under different conditions, in accordance with aspects of the present disclosure.

FIG. 8 is images 274, 276, and 278 of a phantom 280 with a prescribed spatial saturation band applied under different conditions. The phantom 280 includes an anterior side or area 282 with fat and a posterior side or area 284 with water divided by a separation line 286. A grid 288 indicates the location of a prescribed spatial saturation band to suppress signal in each image 274, 276, and 278. A plus sign 290 indicates a local center frequency offset. In image 274, a single spatial saturation pulse was utilized with a bandwidth of 818 hertz (Hz) for the prescribed spatial saturation band. In image 276, a single spatial saturation pulse was utilized with a bandwidth of 2000 Hz for the prescribed spatial saturation band. In image 278, dual spatial saturation pulses were utilized with a bandwidth of 2000 Hz for the prescribed spatial saturation band. The chemical shift of a fat saturation band 292 relative to both the prescribed spatial saturation band 288 and a water saturation band 294 is more pronounced at a lower pulse bandwidth (as depicted in the image 274) than a higher pulse bandwidth (as depicted in the image 276) for a single saturation pulse. However, utilization of a higher pulse bandwidth for a single saturation pulse limits reusage of existing pulses on higher field systems. In image 278, the dual saturation pulses results in both the fat saturation band 292 and the water saturation band 294 being located within the prescribed spatial saturation band 288 free of chemical shift between them.

Figure 9:
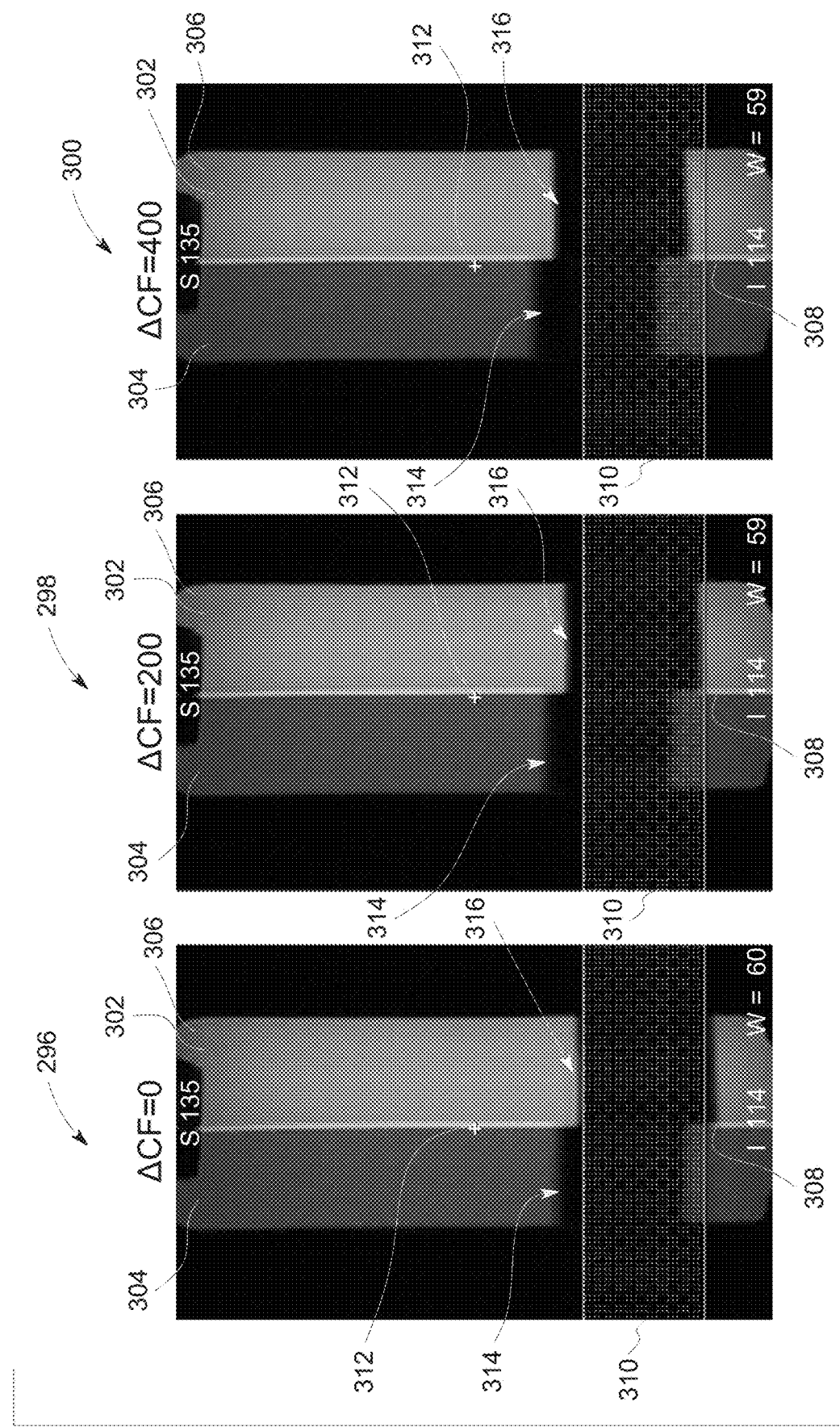
FIG. 9 is images of a phantom with a prescribed spatial saturation band applied in the presence of different local center frequency offsets (e.g., when utilizing a single spatial saturation pulse)

It is important to ensure that the MRI scanner is tuned to a single resonance (e.g., center frequency) for the protons of interest (e.g., usually water) for proper slice positioning and saturation (e.g., fat saturation). The center frequency is the frequency at which the protons of interest are resonating in the magnet's isocenter. However, the center frequency (i.e., local center frequency) may vary between different MRI scanners. Local center frequency offsets (i.e., difference between the center frequency the MRI scanner is set for and the exact frequency the protons of interest are resonating in the magnet's isocenter) impact the utilization of a single spatial saturation pulse for generating a spatial saturation band. FIG. 9 is images 296, 298, and 300 of a phantom 302 with a prescribed spatial saturation band applied in the presence of different local center frequency offsets (e.g., when utilizing a single spatial saturation pulse). The phantom 302 includes an anterior side or area 304 with fat and a posterior side or area 306 with water divided by a separation line 308. A grid 310 indicates the location of a prescribed spatial saturation band to suppress signal in each image 296, 298, and 300. A plus sign 312 indicates a local center frequency offset. In image 296, a single spatial saturation pulse was utilized and a local center frequency offset (ΔCF) was 0. In image 298, a single spatial saturation pulse was utilized and the local center frequency offset was 200 Hz. In image 300, a single spatial saturation pulse was utilized and the local center frequency was 400 Hz. As depicted in the images 296, 298, and 300, both a fat saturation band 314 and a water saturation band 316 shift relative to the prescribed spatial saturation band 310 as the local center frequency offset increases.

Figure 10:
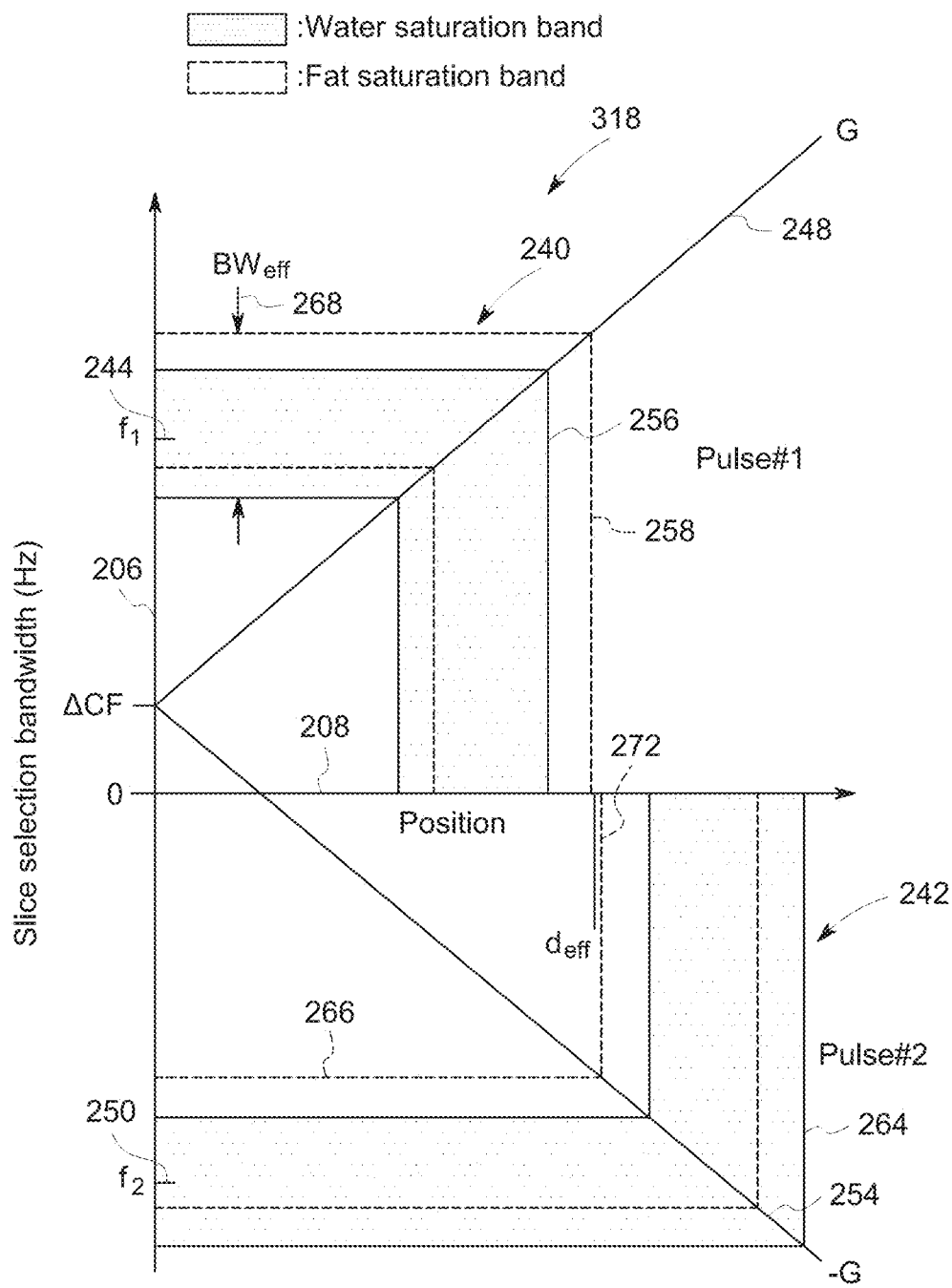
FIG. 10 is a schematic diagram illustrating chemical shift displacement in respective spatial saturation bands (e.g., when utilizing dual spatial saturation pulses) in the presence of a difference in a local center frequency offset, in accordance with aspects of the present disclosure.

FIG. 10 is a schematic diagram illustrating chemical shift displacement in respective spatial saturation bands (e.g., when utilizing dual spatial saturation pulses) in the presence of a difference (of greater than 0) in the local center frequency offset. An upper portion of plot 318 represents the chemical shift displacement for a first spatial saturation band 240 generated by a first spatial saturation pulse (i.e., Pulse#1). A lower portion of plot 318 represents the chemical shift displacement for a second spatial saturation band 242 generated by a second subsequent spatial saturation pulse (i.e., Pulse#2). In general the plot 318 is similar to plot 238 in FIG. 7 except for the difference in a local center frequency offset (ΔCF). In FIG. 7, the local center frequency offset is 0. In FIG. 10, the local center frequency offset is greater than 0. Due to the local center frequency offset being greater than 0, the first spatial saturation band 240 (including both the water saturation band 256 and the fat saturation band 258) and the second spatial saturation band 242 (including both the water saturation band 264 and the fat saturation band 266) have both shifted positions along the slice selection axis 208 relative to the same bands 240, 242 in FIG. 7. In particular, the first spatial saturation band 240 (including both the water saturation band 256 and the fat saturation band 258) is shifted more to the left and the second spatial saturation band 242 (including both the water saturation band 264 and the fat saturation band 266) shifted more to the right. Despite the shifts in the first spatial saturation band 240 and the second spatial saturation band 242, the effective location 272 of the final spatial saturation band falls remains the same along the slice selection axis (and as prescribed).

Figure 11:
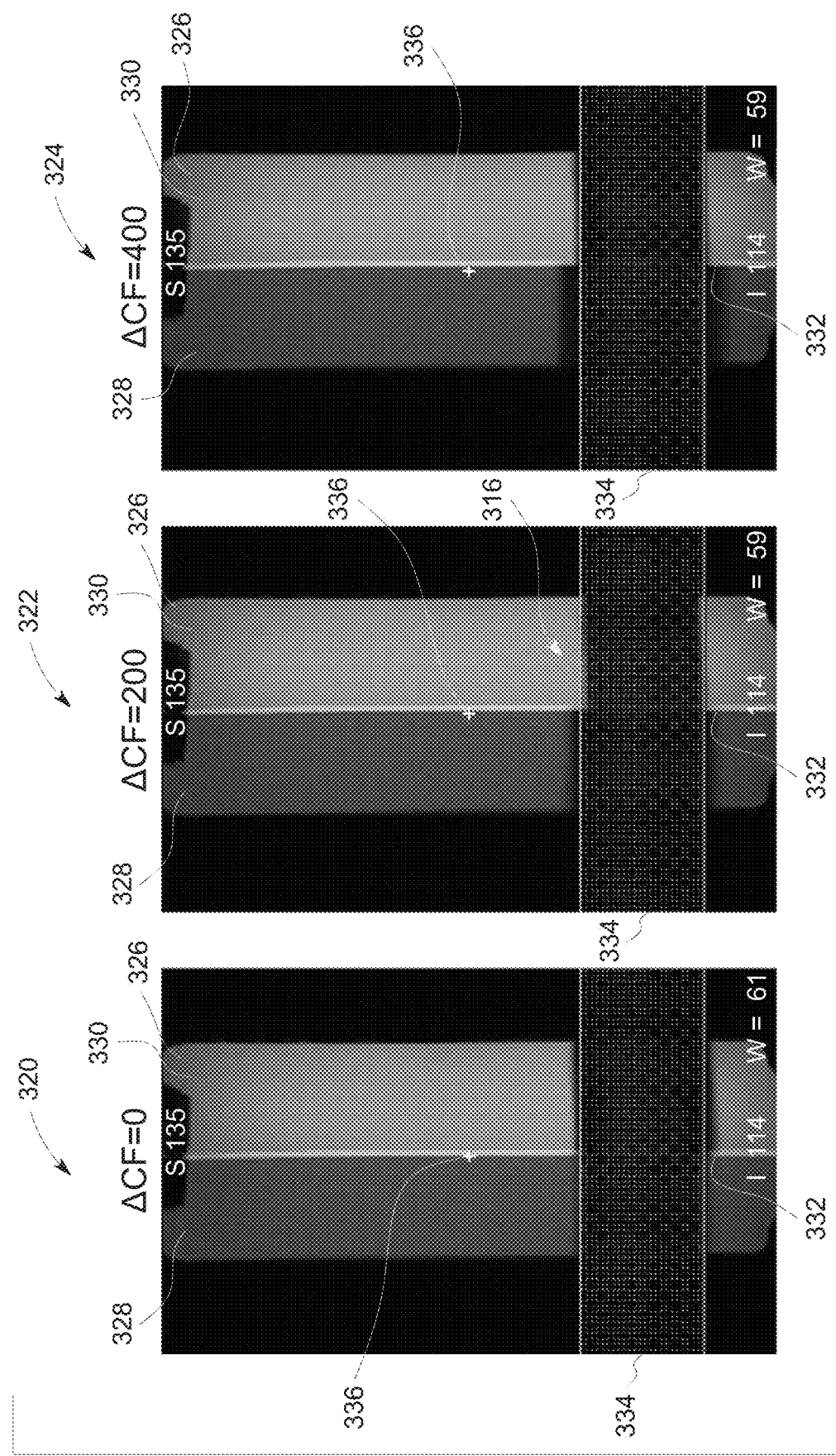
FIG. 11 is images of a phantom with a prescribed spatial saturation band applied in the presence of different local center frequency offsets (e.g., when utilizing dual spatial saturation pulses), in accordance with aspects of the present disclosure.

FIG. 11 is images 320, 322, and 324 of a phantom 326 with a prescribed spatial saturation band applied in the presence of different local center frequency offsets (e.g., when utilizing dual spatial saturation pulses). The phantom 326 includes an anterior side or area 328 with fat and a posterior side or area 330 with water divided by a separation line 332. A grid 334 indicates the location of a prescribed spatial saturation band to suppress signal in each image 320, 322, and 324. A plus sign 336 indicates a local center frequency offset. In image 320, dual spatial saturation pulses were utilized and a local center frequency offset (ΔCF) was 0. In image 322, dual spatial saturation pulses were utilized and the local center frequency offset was 200 Hz. In image 324, dual spatial saturation pulses were utilized and the local center frequency was 400 Hz. As depicted in the images 320, 322, and 324, both a fat saturation band 338 and a water saturation band 340 remained centered about the prescribed spatial saturation band 334 as the local center frequency offset increases. Only a thickness of the bands 338, 340 (in particular, the fat saturation band) changes. Thus, the change in local center frequency offset has no impact with regard to displacing the spatial saturation band when utilizing dual spatial saturation pulses as described above in generating the spatial saturation band.

Figure 12:
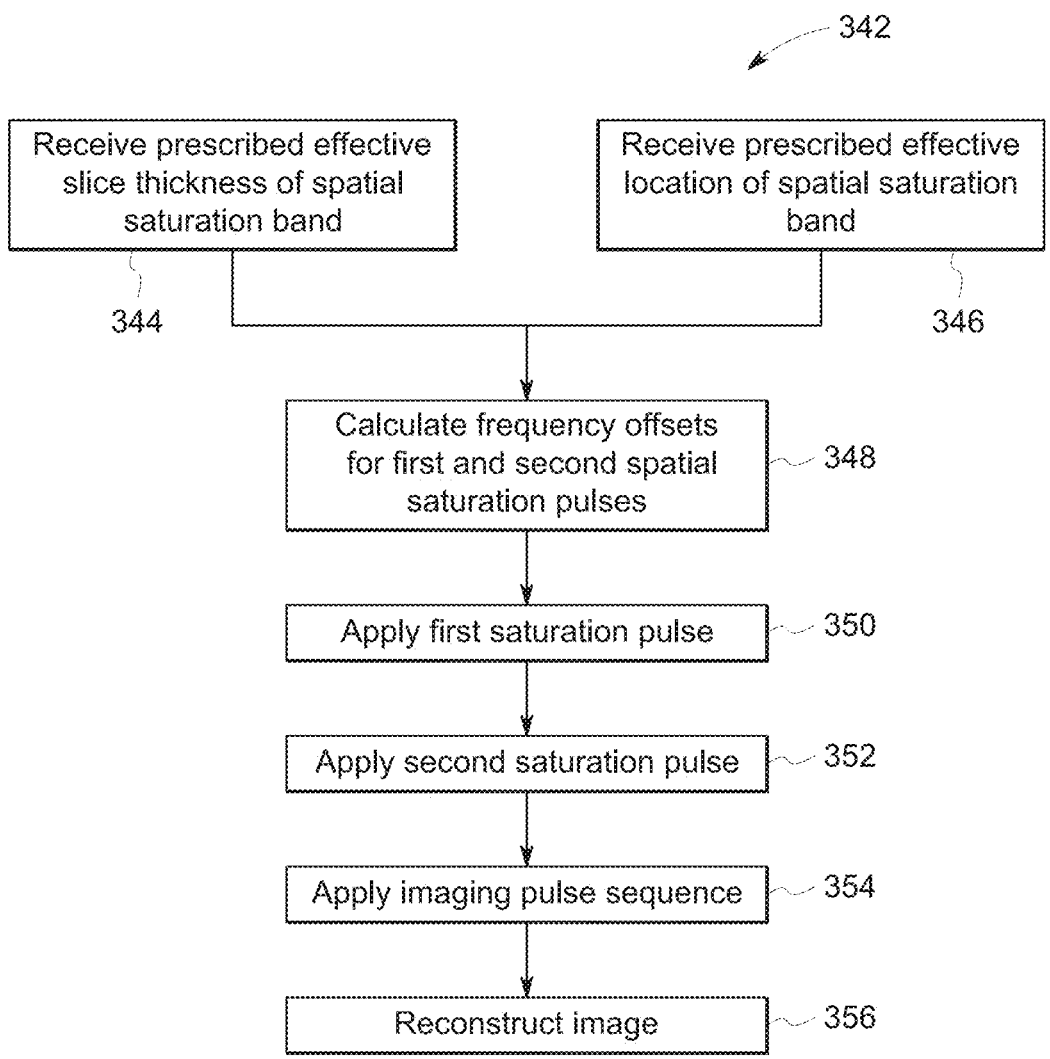
FIG. 12 is a flow chart of a method for operating an MRI system to compensate for chemical shift displacement, in accordance with aspects of the present disclosure.

FIG. 12 is a flow chart of a method 342 for operating an MRI system (e.g., MRI system 100 in FIG. 1) to compensate for chemical shift displacement. The steps of the method 342 maybe performed by a computer, processing system, control circuitry, or other component of the MRI system 100 in FIG. 1. One or more the steps of the method 342 may be performed simultaneously or a different order from that depicted in FIG. 12.

The method 342 includes receiving a prescribed effective slice thickness of a final spatial saturation band (generated from the combined effect of dual spatial saturation pulses) and a prescribed effective location of the final spatial saturation band (block 344). The method 342 also includes receiving a prescribed effective location of the final spatial saturation band (block 346). Both the prescribed effective slice thickness and the prescribed effective location of the final spatial saturation band may be received from inputs into a user interface of the MRI system. The method 342 further includes calculating respective frequency offsets for a first spatial saturation pulse and a second spatial saturation pulse (block 348). The respective frequency offsets are based at least on the prescribed effective slice thickness and the prescribed effective location of the final spatial saturation band. As noted above, the dual spatial saturation pulses need to overlap in order to compensate for chemical shift displacement in the final spatial saturation band.

The method 342 still further includes applying the first spatial saturation pulse within a slice location of an imaging volume of the subject in which MRI data is to be acquired (block 350). The first spatial saturation pulse results in a first chemical shift displacement between water and fat in a first spatial saturation band. The method 342 even further includes subsequently applying the second spatial saturation pulse within the slice location (i.e., the same slice location) of the imaging volume (block 352). The second spatial saturation pulse is applied immediately following the first spatial saturation pulse (i.e., immediately after the killer gradient of the first spatial saturation pulse). The second spatial saturation pulse results in a second chemical shift displacement between water and fat in a second spatial saturation band. The second chemical shift displacement is different from the first chemical shift displacement. The combination of the first chemical shift displacement in the first spatial saturation band and the second chemical shift displacement in the second spatial saturation band results in a final spatial saturation band insensitive to or free of chemical shift displacement. Steps 344-352 occur prior to applying an imaging pulse sequence to acquire MRI data of the subject.

The method 342 also includes, after applying the dual spatial saturation pulses, applying an imaging pulse sequence to acquire MRI data of the subject within the imaging volume (block 354). The method 342 further includes reconstructing an image from the acquired MRI data, the image being free of chemical shift artifacts (block 356).

Technical effects for the disclosed subject matter includes providing techniques for compensating of chemical shift displacement in a spatial saturation band. In particular, a combination of the two calculated spatial saturation pulses results in a final spatial saturation band being insensitive to or free of chemical shift displacement. The utilization of dual spatial saturation pulses is less sensitive to pulse bandwidth. The disclosed techniques enable the generation of spatial saturation bands with less sensitivity to chemical shift displacement.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for operating a magnetic resonance imaging (MRI) system to compensate for chemical shift displacement, comprising:
    prior to applying an imaging pulse sequence to acquire MRI data of a subject:
        applying a first spatial saturation pulse within a slice location of an imaging volume of the subject in which the MRI data is to be acquired, wherein the first spatial saturation pulse results in a first chemical shift displacement between water and fat in a first spatial saturation band; and
        subsequently applying a second spatial saturation pulse within the slice location, wherein the second spatial saturation pulse results in a second chemical displacement between the water and the fat in a second spatial saturation band that results in a final spatial saturation band being free of chemical shift displacement after application of the second spatial saturation pulse, the second chemical shift displacement being different from the first chemical shift displacement.

2. The method of claim 1, comprising:
    applying the imaging pulse sequence following application of both the first spatial saturation pulse and the second spatial saturation pulse to acquire MRI data of the subject within the imaging volume; and
    reconstructing an image from the acquired MRI data, the image being free of chemical shift artifacts.

3. The method of claim 1, wherein applying the first spatial saturation pulse comprises simultaneously applying both a first saturation radio frequency (RF) pulse and a first saturation gradient magnetic field pulse and then applying a first killer gradient magnetic field pulse.

4. The method of claim 3, wherein subsequently applying the second spatial saturation pulse comprises applying both a second saturation RF pulse and a second saturation gradient magnetic field pulse and then applying a second killer gradient magnetic field pulse.

5. The method of claim 4, wherein the first saturation gradient magnetic field pulse has a first gradient amplitude and the second saturation gradient magnetic field pulse has a second gradient amplitude, the first gradient amplitude being the same as the second gradient amplitude.

6. The method of claim 5, wherein the first saturation gradient magnetic field pulse and the second gradient magnetic field pulse have opposite gradient directions.

7. The method of claim 1, comprising, prior to applying the first spatial saturation pulse and the second spatial saturation pulse, receiving a prescribed effective slice thickness of the final spatial saturation band and a prescribed effective location of the final spatial saturation band.

8. The method of claim 7, comprising, prior to applying the first spatial saturation pulse and the second spatial saturation pulse, calculating a respective frequency offset for both the first spatial saturation pulse and the second spatial saturation pulse based on both the prescribed effective slice thickness and the prescribed effective location.

9. The method of claim 1, wherein an effective bandwidth of the first spatial saturation pulse and the second spatial saturation pulse to excite the first spatial saturation band and the second spatial saturation band, respectively, is larger than a chemical shift between the water and the fat.

10. A magnetic resonance imaging (MRI) apparatus, comprising:
    an MRI system having a plurality of gradient coils positioned about a bore of a magnet, a radio frequency (RF) transceiver system and an RF switch controlled by a pulse module to transmit RF signals to an RF coil assembly to acquire MRI images; and
    a computer coupled to the MRI system and programmed to:
        prior to applying an imaging pulse sequence to acquire MRI data of a subject:
            apply a first spatial saturation pulse within a slice location of an imaging volume of the subject in which the MRI data is to be acquired, wherein the first spatial saturation pulse results in a first chemical shift displacement between water and fat in a first spatial saturation band; and
            subsequently apply a second spatial saturation pulse within the slice location, wherein the second spatial saturation pulse results in a second chemical displacement between the water and the fat in a second spatial saturation band that results in a final spatial saturation band being free of chemical shift displacement after application of the second spatial saturation pulse, the second chemical shift displacement being different from the first chemical shift displacement.

11. The MRI apparatus of claim 10, wherein the computer is programmed to:
    apply the imaging pulse sequence following application of both the first spatial saturation pulse and the second spatial saturation pulse to acquire MRI data of the subject within the imaging volume; and
    reconstruct an image from the acquired MRI data, the image being free of chemical shift artifacts.

12. The MRI apparatus of claim 10, wherein applying the first spatial saturation pulse comprises simultaneously applying both a first saturation radio frequency (RF) pulse and a first saturation gradient magnetic field pulse and then applying a first killer gradient magnetic field pulse.

13. The MRI apparatus of claim 12, wherein subsequently applying the second spatial saturation pulse comprises applying both a second saturation RF pulse and a second saturation gradient magnetic field pulse and then applying a second killer gradient magnetic field pulse.

14. The MRI apparatus of claim 13, wherein the first saturation gradient magnetic field pulse has a first gradient amplitude and the second saturation gradient magnetic field pulse has a second gradient amplitude, the first gradient amplitude being the same as the second gradient amplitude.

15. The MRI apparatus of claim 14, wherein the first saturation gradient magnetic field pulse and the second gradient magnetic field pulse have opposite gradient directions.

16. The MRI apparatus of claim 10, wherein the computer is programmed to:
prior to applying the first spatial saturation pulse and the second spatial saturation pulse, receive a prescribed effective slice thickness of the final spatial saturation band and a prescribed effective location of the final spatial saturation band.

17. The MRI apparatus of claim 16, wherein the computer is programmed to:
prior to applying the first spatial saturation pulse and the second spatial saturation pulse, calculate a respective frequency offset for both the first spatial saturation pulse and the second spatial saturation pulse based on both the prescribed effective slice thickness and the prescribed effective location.

18. The MRI apparatus of claim 10, wherein an effective bandwidth of the first spatial saturation pulse and the second spatial saturation pulse to excite the final spatial saturation band is larger than a chemical shift between the water and the fat.

19. A non-transitory computer-readable medium comprising processor-executable code that when executed by one or more processors, causes the one or more processors to:
prior to applying an imaging pulse sequence to acquire MRI data of a subject:
apply a first spatial saturation pulse within a slice location of an imaging volume of the subject in which the MRI data is to be acquired, wherein the first spatial saturation pulse results in a first chemical shift displacement between water and fat in a first spatial saturation band; and
subsequently apply a second spatial saturation pulse within the slice location, wherein the second spatial saturation pulse results in a second chemical displacement between the water and the fat in a second spatial saturation band that results in a final spatial saturation band being free of chemical shift displacement after application of the second spatial saturation pulse, the second chemical shift displacement being different from the first chemical shift displacement.

20. The non-transitory computer-readable medium of claim 19, wherein the processor-executable code, when executed by the one or more processors, causes the one or more processors to:
apply the imaging pulse sequence following application of both the first spatial saturation pulse and the second spatial saturation pulse to acquire MRI data of the subject within the imaging volume; and
reconstruct an image from the acquired MRI data, the image being free of chemical shift artifacts.

* * * * *